United States Patent
Hirabayashi et al.

[11] Patent Number: 6,107,842
[45] Date of Patent: Aug. 22, 2000

[54] IMPEDANCE CONVERSION CIRCUIT, VIDEO APPARATUS, AUDIO APPARATUS, AND COMMUNICATION APPARATUS

[75] Inventors: Atsushi Hirabayashi, Tokyo; Kosuke Fujita; Kenji Komori, both of Kanagawa; Norihiro Murayama, Chiba, all of Japan

[73] Assignee: Sony Corporation, Tokyo, Japan

[21] Appl. No.: 09/229,686

[22] Filed: Jan. 13, 1999

[30] Foreign Application Priority Data

Jan. 14, 1998 [JP] Japan ................................ 10-005716

[51] Int. Cl.[7] .................................................. H02M 11/00
[52] U.S. Cl. ........................... 327/103; 327/563; 327/308
[58] Field of Search ............................ 327/103, 560–563, 327/63, 65, 308

[56] References Cited

U.S. PATENT DOCUMENTS

| | | | |
|---|---|---|---|
| 4,498,053 | 2/1985 | Katakura et al. | 330/261 |
| 5,552,729 | 9/1996 | Deguchi | 327/103 |
| 5,654,666 | 8/1997 | Taga et al. | 327/563 |
| 5,661,432 | 8/1997 | Chang et al. | 327/103 |
| 5,914,630 | 6/1999 | Peterson | 327/563 |

*Primary Examiner*—Toan Tran
*Attorney, Agent, or Firm*—Ronald P. Kananen; Rader, Fishman & Grauer

[57] ABSTRACT

An impedance conversion circuit for the use with a video apparatus, an audio apparatus, or a communication apparatus is provided. The impedance conversion circuit can be used at a frequency higher than that conventionally used and is suitable for formation as an integrated circuit. A video apparatus using this impedance conversion circuit, and the like are also proposed. Driving current is supplied to first and second terminals of an impedance circuit in accordance with voltages of first and second input terminals, respectively, and current is made to flow out of the second and first output terminals in accordance with the first and second terminal voltages of the impedance circuit, respectively.

16 Claims, 4 Drawing Sheets

IMPEDANCE CONVERSION CIRCUIT, VIDEO APPARATUS, AUDIO APPARATUS, AND COMMUNICATION APPARATUS

BACKGROUND OF THE INVENTION

1. Field of the Invention

The present invention relates to an impedance conversion circuit, a video apparatus, an audio apparatus, and a communication apparatus, and can be applied to, for example, a radio receiver, a television receiver, a satellite broadcasting receiver, a video tape recorder, a mobile communication apparatus, and the like. The present invention proposes an impedance conversion circuit which can be used at a frequency higher than that conventionally used and which is suitable for use in an integrated circuit. A driving current is supplied to first and second terminals of the impedance circuit in accordance with voltages of first and second input terminals of the conversion circuit, causing current to flow out of second and first output terminals of the conversion circuit in accordance with first and second terminal voltages of the impedance circuit. A video apparatus using this impedance conversion circuit, and the like are also proposed.

2. Description of the Related Art

Figure 5:
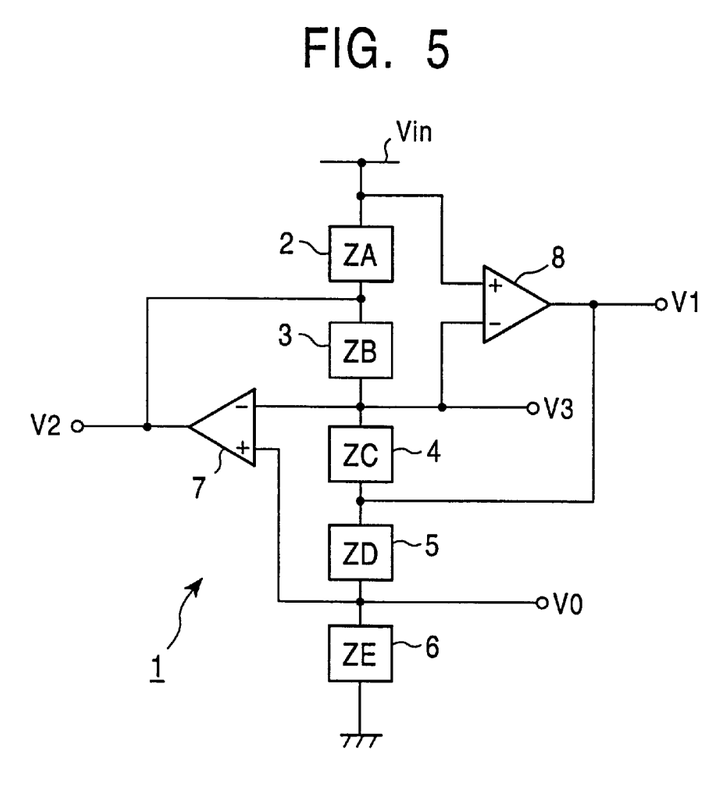
FIG. 5 is a block diagram showing a conventional impedance conversion circuit.

Hitherto, in an apparatus, such as an audio apparatus, for processing a signal of a relatively low frequency, impedance based on desired characteristics is produced by an impedance conversion circuit 1 such as that shown in FIG. 5, and an audio signal or the like is processed by this produced impedance.

More specifically, in the impedance conversion circuit 1, five impedance circuits 2 to 6 are connected in series to each other, and operational amplifier circuits 7 and 8 are connected among these impedance circuits 2 to 6. Here, the five impedance circuits 2 to 6 are set at predetermined impedances ZA to ZE in accordance with a required impedance, respectively. The first operational amplifier circuit 7 is connected at its inversion input terminal to the connection mid-point of the second and third impedance circuits 3 and 4 and connected at its non-inversion input terminal to the connection mid-point of the fourth and fifth impedance circuits 5 and 6, and is connected at its output terminal to the connection mid-point of the first and second impedance circuits 2 and 3. The second operational amplifier circuit 8 is connected at its non-inversion input terminal to an input end Vin of the impedance conversion circuit and connected at its inversion input terminal to the connection mid-point of the second and third impedance circuits 3 and 4, and is connected at its output terminal to the connection mid-point of the third and fourth impedance circuits 4 and 5.

This makes it possible for the impedance conversion circuit 1 to express an input impedance Zin viewed from an input end Vin by the following equation, thereby making it possible for the impedance circuits 2 to 6 to be set in various ways in order to set the input impedance Zin to a desired value.

$$Zin = \frac{ZA \times ZE \times ZC}{ZB \times ZD} \quad (1)$$

However, this impedance conversion circuit 1 has a problem in that the operating frequency is limited to 1 MHz or less by the operational amplifier circuits 7 and 8. As a result, it is difficult to apply the impedance conversion circuit 1 to a signal processing circuit in a frequency band, such as a video band.

When the impedance conversion circuit 1 is formed into an integrated circuit in such a manner as to be integrated with another signal processing circuit, the operational amplifier circuits 7 and 8 are formed into an integrated circuit, and the number of elements is increased correspondingly, resulting in the problem of unsuitability for formation into an integrated circuit.

SUMMARY OF THE INVENTION

The present invention, which has been achieved in view of the above points, proposes an impedance conversion circuit which can be used at a frequency higher than that conventionally used and which is suitable for formation into an integrated circuit, or a video apparatus, an audio apparatus, and a communication apparatus using an impedance conversion circuit.

In order to solve such problems in the present invention, where the impedance circuit is DC-biased by a high impedance, a driving current is supplied to the first and second terminals of an impedance circuit in accordance with the voltages of the first and second input ends, respectively, and current is made to flow out of the second and first input ends in accordance with the voltages of these first and second terminals, respectively.

Where the impedance circuit is DC-biased by a high impedance, if the driving current is supplied to the first and second terminals of the impedance circuit in accordance with the voltages of the first and second input ends, respectively, and current is made to flow out of the second and first input ends in accordance with the voltages of these first and second terminals, respectively, the impedance viewed from the first and second input ends becomes an impedance such that a predetermined resistance value is multiplied by the reciprocal of the impedance by the impedance circuit. This makes it possible to obtain an input impedance produced by converting the impedance of the impedance circuit. At this time, since an impedance conversion circuit is produced by a combination of differential pairs, it is possible to widen the operating frequency without being limited as to a frequency as in the case of an operational amplifier circuit, and it is possible to use the impedance conversion circuit in an integrated circuit with a simple construction.

The above and further objects, aspects and novel features of the invention will become more apparent from the following detailed description when read in connection with the accompanying drawings.

DESCRIPTION OF THE PREFERRED EMBODIMENTS

The embodiments of the present invention will be described below in detail with reference to the drawings wherever appropriate.

(1) First embodiment

Figure 1:
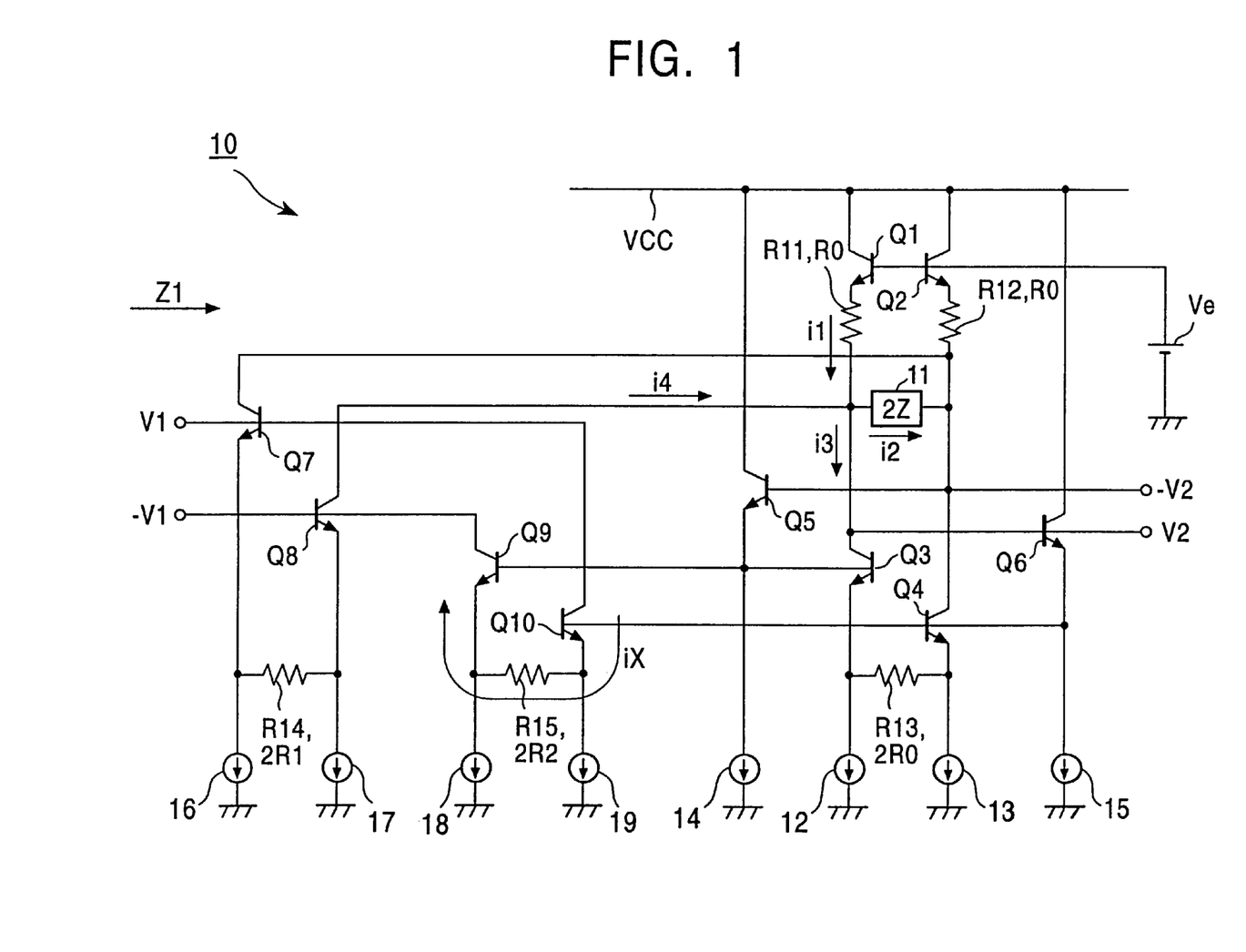
FIG. 1 is a connection diagram showing an impedance conversion circuit according to a first embodiment of the present invention.

FIG. 1 is a connection diagram showing an impedance conversion circuit according to a first embodiment of the present invention. This impedance conversion circuit 10 forms an integrated circuit in such a manner as to be integrated with a predetermined signal processing circuit disposed in a pre-stage and is applied, for example, to signal processing of an audio signal.

In this impedance conversion circuit 10, transistors Q1 and Q2 form a differential pair. That is, the transistors Q1 and Q2 are connected at their collectors to a power source VCC, with a bias power source Ve being connected to the bases. Further, in the transistors Q1 and Q2, the emitters are connected to resistors R11 and R12, respectively, and a predetermined impedance circuit 11 is connected between the other ends of these resistors R11 and R12. Furthermore, in the transistors Q1 and Q2, the other ends of these resistors R11 and R12 are grounded via transistors Q3 and Q4, respectively.

These transistors Q3 and Q4 are connected at their emitters to current sources 12 and 13, respectively, the section between the emitters is connected by a resistor R13, and base voltages are set in transistors Q5 and Q6.

In the transistors Q5 and Q6, the emitters are grounded by current sources 14 and 15, respectively, and the collectors are connected to the power source VCC. Further, the transistors Q5 and Q6 receive a terminal voltage of the transistor Q2 side and a terminal voltage of the transistor Q1 side, respectively, from the impedance circuit 11, and in contrast to this base connection, the emitters are connected to the bases of the transistors Q3 and Q4 corresponding to the transistors Q1 and Q2 sides, respectively.

With this construction, the transistors Q1 and Q2, together with the power source Ve, the current sources 12 to 15, the transistors Q3 to Q6, and the resistors R11 to R13, form a high-impedance bias circuit for DC-biasing the impedance circuit 11 in accordance with a voltage determined by the bias power source Ve.

Here, the resistors R11 and R12 are set at an equal resistance value R0, and the resistor R13 is set at a resistance value 2R0, twice as great as the resistance value R0 of the resistors R11 and R12.

Transistors Q7 and Q8 are connected at their emitters to current sources 16 and 17, respectively, and the section between the emitters is connected by a resistor R14. Further, first and second input terminals which recieve input signals V1 and −V1, respectively, from the signal processing circuit in the pre-stage are each connected to a base of transistors Q7 and Q8, respectively, and the collectors are connected to respective terminals of the impedance circuit 11. Here, the resistor R14 is set at a resistance value 2R1.

With this construction, the transistors Q7 and Q8 form a first differential pair which supplies driving current to the first and second terminals of the impedance circuit 11, respectively, in accordance with voltages V1 and −V1 of the first and second input terminals.

In contrast, transistors Q9 and Q10 are connected at their emitters to current sources 18 and 19, respectively, and the section between the emitters is connected by a resistor R15. Further, the collectors are respectively connected to the second and first input ends, and the bases are respectively connected to the emitters of the transistors Q5 and Q6. With this construction, the transistors Q9 and Q10, together with the transistors Q5 and Q6, the current sources 14, 15, 18, and 19, and the resistor R15, form a second differential pair that causes current to flow out of the second and first input terminals, respectively, in accordance with the voltages of the first and second terminals of the impedance circuit 11. Here, the resistor R15 is set at a resistance value 2R2.

In the foregoing description of the construction, the input signals V1 and −V1 input from the signal processing circuit of the pre-stage are input to the transistors Q7 and Q8, and as a result of the current driving of these transistors Q7 and Q8, a driving current is supplied to the impedance circuit 11.

Here, if the terminal voltages of the impedance circuit 11 are denoted as V2 and −V2, respectively, and if Kirchhoff's law is applied to the end of the transistor Q1 side of the impedance circuit 11, in this impedance conversion circuit 10, the following relational equation can be obtained. Here, i1 denotes current of the resistor R11, and i2 denotes current of the impedance circuit 11. Further, i3 denotes collector current of the transistor Q3, and i4 denotes collector current of the transistor Q8. Furthermore, Z is a value of one half of the impedance 2Z of the impedance circuit 11.

$$i2 + i3 = i1 + i4 \qquad (2)$$

$$i1 = \frac{-V2}{R0} \qquad (3)$$

$$i2 = \frac{V2}{Z} \qquad (4)$$

$$i4 = \frac{V1}{R1} \qquad (5)$$

Here, since both ends of the impedance circuit 11 are connected to the bases of the transistors Q5 and Q6, and the emitters of these transistors Q5 and Q6 are connected to the bases of the transistors Q4 and Q3 connected to the other transistors Q2 and Q1, current i3 of equation (2) can be expressed by the following equation:

$$i3 = \frac{-V2 - (+V2)}{2R0} \qquad (6)$$
$$= \frac{-V2}{R0}$$

When these equations (3) to (6) are substituted in equation (2), the following relational equation can be obtained.

$$\frac{V2}{Z} - \frac{V2}{R0} = \frac{V1}{R1} - \frac{V2}{R0} \qquad (7)$$
$$\therefore v2 = \frac{V1 \times Z}{R1}$$

Here, since the bases of the transistors Q9 to Q10 are connected to the emitters of the transistors Q5 and Q6, respectively, the impedance conversion circuit 10 causes these transistors Q9 and Q10 to allow current iX expressed by the following equation to flow out of the first and second input ends in accordance with the terminal voltage of the impedance circuit 11.

$$iX = \frac{V2 - (-V2)}{2R2} = \frac{V2}{R2} \qquad (8)$$

Here, when equation (7) is substituted in equation (8), the following relational equation can be obtained.

$$iX = \frac{V1 \times Z}{R1 \times R2} \quad (9)$$

Figure 2:
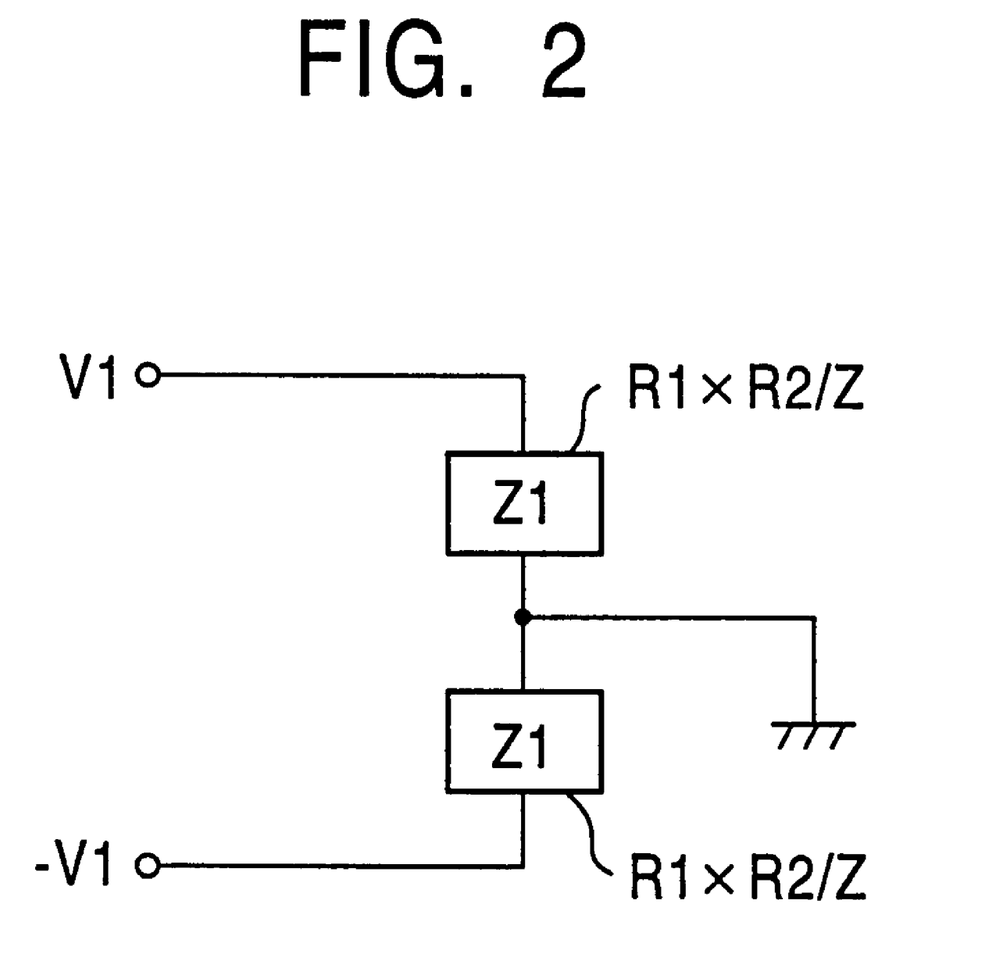
FIG. 2 is a connection diagram showing an equivalent circuit of the impedance conversion circuit of FIG. 1.

This shows that an impedance Z1, when the impedance conversion circuit 10 is viewed from the input end, is expressed by the following equation, and that as shown in FIG. 2, the impedance Z1 is connected across both ends of the input terminals. That is, the impedance Z1 viewed from the input terminal of the impedance conversion circuit 10 becomes a value such that the resistance values R1 and R2 which are half of the resistance values 2R1 and 2R2 of the resistors R14 and R15 disposed in a differential pair are multiplied by the reciprocal of one half of the impedance 2Z of the impedance circuit 11. Further, grounding is made at the mid-point of this impedance Z1.

$$Z1 = \frac{V1}{iX} = \frac{R1 \times R2}{Z} \quad (10)$$

With this construction, in this impedance conversion circuit 10, it can be seen that the impedance of the impedance circuit 11 can be converted, and various elements may be disposed in the impedance circuit 11 in order to realize desired characteristics in the entire integrated circuit.

More specifically, if a capacitor of a capacitance C is connected to the impedance circuit 11, the impedance Z of the impedance circuit 11 can be expressed as 1/SC. Therefore, by substituting this in equation (10), the input impedance Z1 of this impedance conversion circuit 10 can be expressed by the following equation. Here, the letter S denotes a Laplace operator.

$$Z1 = SC \cdot R1 \cdot R2 \quad (11)$$

This shows that a capacitor may be disposed in the impedance circuit 11 so as to form an inductance of a value C·R1·R2 within the integrated circuit, and that the resistance values R1 and R2 may be selected to form a desired inductance by a small-capacitance capacitor.

In contrast to this, if an inductance of a value L is connected to the impedance circuit 11, the impedance Z of the impedance circuit 11 can be expressed as SL. Therefore, by substituting this in equation (10), the input impedance Z1 of this impedance conversion circuit 10 can be expressed by the following equation:

$$Z1 = \frac{R1 \cdot R2}{SL} \quad (12)$$

This shows that an inductance may be disposed in the impedance circuit 11 in order to form a capacitor with a capacitance L/R1R2, and that the resistance values R1 and R2 may be selected to form a capacitor with a desired capacitance by a small-capacity inductance.

Furthermore, if a parallel connection circuit with an inductance L and a capacitor C is disposed in the impedance circuit 11, the impedance Z can be expressed as 1/(SC+1/SL). Therefore, by substituting this in equation in (10), the input impedance Z1 of the impedance conversion circuit 10 can be expressed by the following equation.

$$Z1 = \frac{R1 \cdot R2}{\dfrac{1}{SC + \dfrac{1}{SL}}} \quad (13)$$

$$= SC \cdot R1 \cdot R2 + \frac{R1 \cdot R2}{SL}$$

This shows that, in this case, it is possible to obtain an impedance Z1 with a series connection circuit of a capacitor with a capacitance L/R1R2 and an inductance with a value CR1R2.

Furthermore, if a series connection circuit with an inductance L and a capacitor C is disposed in the impedance circuit 11, the impedance Z can be expressed as 1/SC+SL. Therefore, by substituting this in equation (10), the input impedance Z1 of this impedance conversion circuit 10 can be expressed by the following equation:

$$Z1 = \frac{R1 \cdot R2}{SL + \dfrac{1}{SC}} \quad (14)$$

$$= \frac{1}{\dfrac{SL}{R1 \cdot R2} + \dfrac{1}{SC \cdot R1 \cdot R2}}$$

This shows that, in this case, an impedance Z1 can be obtained from a parallel connection circuit including a capacitor with a capacitance L/R1R2 and an inductance with a value CR1R2.

According to the foregoing description of the construction, by supplying driving current to the first and second terminals of the impedance circuit 11 in accordance with the voltages V1 and −V1 of the first and second input terminals and by causing current to flow out of the second and first input terminals in accordance with these first and second terminal voltages, an impedance conversion circuit can be formed from a plurality of differential transistor pairs. This makes it possible to obtain an impedance conversion circuit which can be used at a frequency higher than that used conventionally and which is suitable for formation as an integrated circuit.

Furthermore, since the impedance conversion circuit is formed by a differential pair of NPN-type transistors, the entire construction can be simplified, and an operable power-source voltage VCC can be reduced to less than that conventionally used.

(2) Second embodiment

Figure 3:
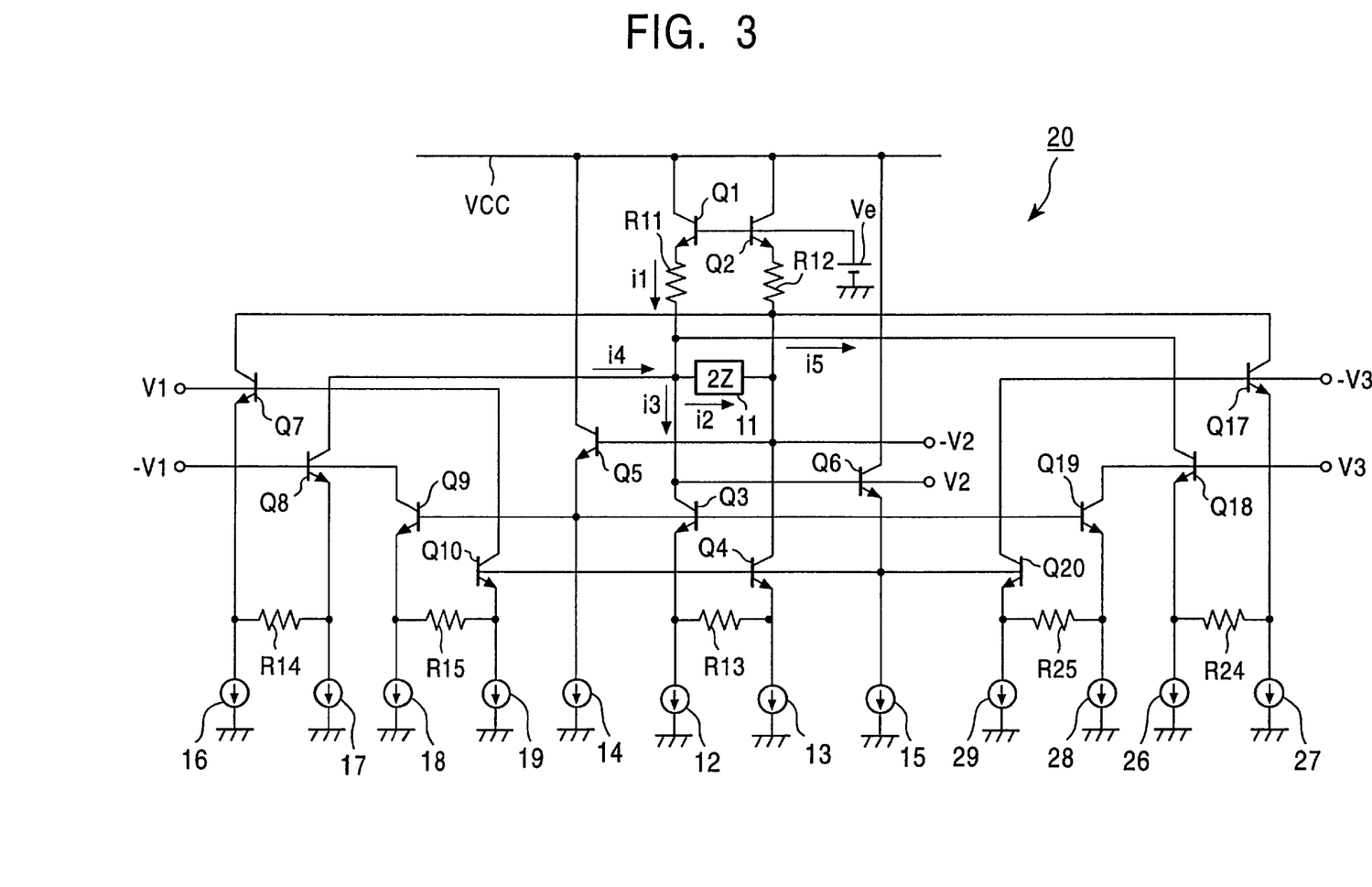
FIG. 3 is a connection diagram showing an impedance conversion circuit according to a second embodiment of the present invention.

FIG. 3 is a connection diagram showing an impedance conversion circuit according to a second embodiment of the present invention. In this embodiment, an impedance conversion circuit 20, together with a predetermined signal processing circuit, is formed as an integrated circuit. In the construction shown in FIG. 3, components which are the same as those described with reference to FIG. 1 are given the corresponding reference numerals, and a duplicate description has been omitted.

In this impedance conversion circuit 20, output terminals for supplying output signals V3 and −V3 to a signal processing circuit of a post-stage are disposed in such a manner as to correspond to the first and second input terminals which receive input signals V1 and −V1 from a signal processing circuit of a pre-stage. Furthermore, a differential transistor pair formed of transistors Q17 to Q18 corresponding to the differential pair of transistors Q7 to Q8, current sources 26 and 27 by which each emitter of these transistors Q17 to Q18 is grounded, and a resistor R24 which connects the section between the emitters of the transistors Q17 to Q18 are disposed in such a manner as to correspond to the placement of the output terminals with respect to these input terminals. These transistors Q17 to Q18 are connected to the output terminals, the impedance circuit 11, and the like in such a manner as to correspond to the transistors Q7 to Q8, and the resistance value of the resistor R24 is set at a resistance value equal to that of the resistor R14.

Furthermore, in the impedance conversion circuit 20, a differential transistor pair formed of transistors Q19 to Q20 corresponding to the differential pair of the transistors Q9 to Q10, current sources 28 and 29 by which each emitter of these transistors Q19 to Q20 is grounded, and a resistor R25 which connects the section between the emitters of the transistors Q19 to Q20 are disposed in such a manner as to correspond to the placement of the output terminals with respect to these input terminals. These transistors Q19 to Q20 are connected to the output terminals, the impedance circuit 11, and the like in such a manner as to correspond to the transistors Q9 to Q10, and the resistance value of the resistor R25 is set at a resistance value equal to that of the resistor R15.

In the construction shown in FIG. 3, if Kirchhoff's law is applied to one end of the impedance circuit 11 in the same manner as in the first embodiment, the following relational equation can be obtained, where i5 denotes a collector current of the transistor Q18.

$$i2 + i5 + i3 = i1 + i4 \qquad (15)$$

$$i5 = \frac{V3}{R1} \qquad (16)$$

If this equation (16), together with equations (3) to (6), is substituted in equation (15), the following relational equation can be obtained:

$$\frac{V2}{Z} + \frac{V3}{R1} - \frac{V2}{R0} = \frac{V1}{R1} - \frac{V2}{R0} \qquad (17)$$

$$\therefore V2 = \frac{(V1 - V3) \times Z}{R1}$$

In this case, the transistors Q9 to Q10 cause current iX1 expressed by the following equation, instead of the above-mentioned current value iX with reference to equation (8), to flow out of the first and second output terminals, and similarly, the transistors Q19 to Q20 cause current iX2 to flow out of the output terminals.

$$iX1 = \frac{V2}{R2} \qquad (18)$$
$$= \frac{Z(V1 - V3)}{R1R2}$$

$$iX2 = \frac{-V2}{R2} \qquad (19)$$
$$= \frac{-Z(V1 - V3)}{R1R2}$$
$$= -iX1$$

This shows in this embodiment that, in the first input terminals having an input voltage V1 and the first corresponding output terminals having an output voltage V3, current of an equal value iX1 (iX2) flows in a different direction. Similarly, in a second input terminals having an input voltage −V1 and the second corresponding output terminals having an output voltage −V3, current of an equal value iX1 (iX2) flows in a different direction.

Figure 4:
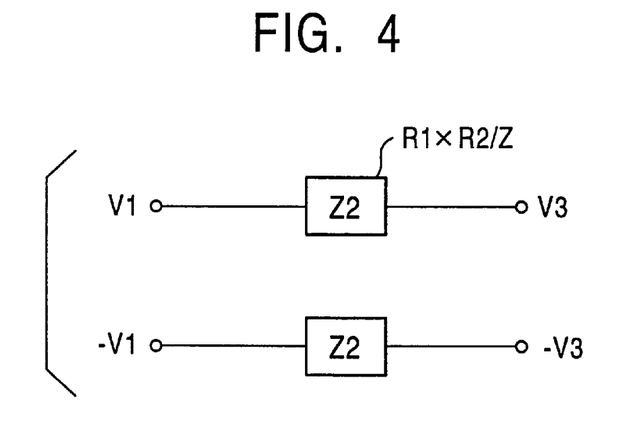
FIG. 4 is a connection diagram showing an equivalent circuit of the impedance conversion circuit of FIG. 3.

This means that a current value, equal to a current value which is input and output between the first and second input terminals is input and output between the first and second output terminals. As a result, as shown in FIG. 4, in this impedance conversion circuit 20, a circuit network of a two-terminal pair with a predetermined impedance Z2 is formed between the input terminals and the output terminals.

With this construction, regarding the potential difference (V1−V3) between the input voltage V1 and the output voltage V3, the impedance Z2 of the two-terminal pair circuit network can be calculated by the following relational equation.

$$Z2 = \frac{(V1 - V3)}{iX1} = \frac{R1 \cdot R2}{Z} \qquad (20)$$

More specifically, in this impedance conversion circuit 20, the predetermined impedance Z2 is connected between the input terminal and the output terminal, and this impedance Z2 becomes a value equal to the resistance values R1 and R2, which are half of the resistance values 2R1 and 2R of the resistors R14 and R15 disposed in a differential pair, multiplied by the reciprocal of one half of the impedance Z2 of the impedance circuit 11.

Further, since the impedance Z2 of this equation (20) is equal to the impedance Z1 described with reference to equation (10), the relations of equations (10) to (14) hold. When capacitance and inductance are applied to the impedance circuit 11, an impedance Z2 similar to a case in which an inductance and a capacitance are each disposed can be obtained. In the case of parallel connection and series connection of capacitances and inductances, it can be seen that these can be converted from series to parallel form or vice versa.

According to the construction shown in FIG. 3, similar to the construction of the first embodiment, a third differential transistor pair Q1 and Q2 are provided for supplying driving current to the first and second terminals of the impedance circuit 11 in accordance with the voltages of the first and second output terminals V2 and −V2, respectively, and also disposed is a fourth differential transistor pair Q5 and Q6 for causing current to flow out of the second and first output terminals V2 and −V2, respectively, in accordance with the voltages of the first and second terminals of the impedance circuit 11. Therefore, it is possible to form a two-terminal pair circuit network by a desired impedance so that advantages similar to those of the first embodiment can be obtained.

Furthermore, it is possible to construct a ladder-type transmission network of inductances and capacitances, which has hitherto been difficult, within an IC, making it possible to realize a T-type circuit using an elliptical function. At the same time, it is possible to realize a filter having a high Q value with a two-terminal pair circuit network by using a small number of elements.

In addition, since a two-terminal pair can be formed, it is possible to cause the impedance conversion circuit to operate in a completely differential mode. This makes it possible to construct an active filter which operates in a differential mode, which has been difficult to realize by a conventional active filter. Further, such a differential operation type makes it possible to form a signal current loop within a circuit, to improve stability as an impedance conversion circuit, to reduce power consumption, and to reduce the chip area.

(3) Another embodiment

Although in the above-described embodiments, a case is described in which the present invention is applied to a signal processing circuit for an audio signal, the present invention is not limited to this case and can be widely applied to various audio apparatuses, video apparatuses such as video tape recorders, and radio communication apparatuses such as portable telephones, and wire communication apparatuses such as cable televisions.

As has been described above, according to the present invention, driving current is supplied to the first and second terminals of the impedance circuit in accordance with the voltages of the first and second input terminal, and current is made to flow out of the second and first input terminal in accordance with these first and second terminal voltages. Therefore, it is possible to obtain an impedance conversion circuit which can be used at a frequency higher than that conventionally used and which is suitable for formation as an integrated circuit.

Many different embodiments of the present invention may be constructed without departing from the spirit and scope of the present invention. It should be understood that the present invention is not limited to the specific embodiments described in this specification. To the contrary, the present invention is intended to cover various modifications and equivalent arrangements included within the spirit and scope of the invention as hereafter claimed. The scope of the following claims is to be accorded the broadest interpretation so as to encompass all such modifications, equivalent structures and functions.

What is claimed is:

1. An impedance conversion circuit, comprising:
    an impedance circuit with a predetermined impedance having first and second terminals;
    a high impedance bias circuit for DC-biasing said impedance circuit;
    a first differential transistor pair for causing current to flow out of voltages of first and second input terminals of said conversion circuit in accordance with voltages of the first and second terminals of said impedance circuit, respectively; and
    a second differential transistor pair for causing current to flow out of second and first output terminals of said conversion circuit in accordance with the voltages of the first and second terminals of said impedance circuit, respectively.

2. An impedance conversion circuit according to claim 1, wherein said high-impedance bias circuit comprises a pair of differential-pair transistors, whose base voltage is held at a predetermined voltage and a section between emitters of which is connected by said impedance circuit.

3. An impedance conversion circuit according to claim 1, further comprising:
    a third differential transistor pair for supplying driving current to the first and second terminals of said impedance circuit in accordance with the voltages of third and fourth input terminals of said conversion circuit, respectively; and
    a fourth differential transistor pair for causing current to flow out of the fourth and third input terminals in accordance with the voltages of the first and second terminals of said impedance circuit, respectively.

4. An impedance conversion circuit according to claim 3, wherein said high-impedance bias circuit comprises a pair of differential-pair transistors, whose base voltage is held at a predetermined voltage and a section between emitters of which is connected by said impedance circuit.

5. A video apparatus comprising an impedance conversion circuit,
    wherein said impedance conversion circuit comprises:
        an impedance circuit with a predetermined impedance having first and second terminals;
        a high-impedance bias circuit for DC-biasing said impedance circuit;
        a first differential transistor pair for supplying driving current to the first and second terminals of said impedance circuit in accordance with voltages of first and second input terminals of said conversion circuit, respectively; and
        a second differential transistor pair for causing current to flow out of second and first input terminals in accordance with the voltages of the first and second terminals of said impedance circuit, respectively.

6. A video apparatus according to claim 5, wherein said high-impedance bias circuit comprises a pair of differential-pair transistors, whose base voltage is held at a predetermined voltage and a section between emitters of which is connected by said impedance circuit.

7. A video apparatus according to claim 5, further comprising:
    a third differential pair for supplying driving current to the first and second terminals of said impedance circuit in accordance with the voltages of third and fourth input terminals of said conversion circuit, respectively, and;
    a fourth differential transistor pair for causing current to flow out of said fourth and third input terminals in accordance with the voltages of the first and second terminals of said impedance circuit.

8. A video apparatus according to claim 7, wherein said high-impedance bias circuit comprises a pair of differential-pair transistors, whose base voltage is held at a predetermined voltage and a section between emitters of which is connected by said impedance circuit.

9. An audio apparatus comprising an impedance conversion circuit,
    wherein said impedance conversion circuit comprises:
        an impedance circuit with a predetermined impedance having first and second terminals;
        a high-impedance bias circuit for DC-biasing said impedance circuit;
        a first differential transistor pair for supplying driving current to the first and second terminals of said impedance circuit in accordance with voltages of first and second input terminals of said conversion circuit, respectively; and
        a second differential transistor pair for causing current to flow out of second and first input terminals of said conversion circuit in accordance with the voltages of the first and second terminals of said impedance circuit, respectively.

10. An audio apparatus according to claim 9, wherein said high-impedance bias circuit comprises a pair of differential-pair transistors, whose base voltage is held at a predetermined voltage and a section between emitters of which is connected by said impedance circuit.

11. An audio apparatus according to claim 9, further comprising:
    a third differential transistor pair for supplying driving current to the first and second terminals of said impedance circuit in accordance with the voltages of third and fourth input terminals of said conversion circuit, respectively; and
    a fourth differential transistor pair for causing current to flow out of said fourth and third input terminals in accordance with the voltages of the first and second terminals of said impedance circuit.

12. An audio apparatus according to claim 11, wherein said high-impedance bias circuit comprises a pair of differential-pair transistors, whose base voltage is held at a predetermined voltage and a section between emitters of which is connected by said impedance circuit.

13. A communication apparatus comprising an impedance conversion circuit, wherein said impedance conversion circuit comprises:
- an impedance circuit with a predetermined impedance having first and second terminals;
- a high-impedance bias circuit for DC-biasing said impedance circuit;
- a first differential transistor pair for supplying driving current to the first and second terminals of said impedance circuit in accordance with voltages of first and second input terminals of said conversion circuit, respectively; and
- a second differential transistor pair for causing current to flow out of second and first input terminals of said conversion circuit in accordance with the voltages of the first and second input terminals of said impedance circuit, respectively.

14. A communication apparatus according to claim 13, wherein said high-impedance bias circuit comprises a pair of differential-pair transistors, whose base voltage is held at a predetermined voltage and a section between emitters of which is connected by said impedance circuit.

15. A communication apparatus according to claim 13, further comprising:
- a third differential transistor pair for supplying driving current to the first and second terminals of said impedance circuit in accordance with the voltages of third and fourth input terminals of said conversion circuit, respectively; and
- a fourth differential transistor pair for causing current to flow out of the fourth and third input terminals in accordance with the voltages of the first and second terminals of said impedance circuit.

16. A communication apparatus according to claim 15, wherein said high-impedance bias circuit comprises a pair of differential-pair transistors, whose base voltage is held at a predetermined voltage and a section between emitters of which is connected by said impedance circuit.

* * * * *